United States Patent

Kumashiro

[11] Patent Number: 5,847,973
[45] Date of Patent: Dec. 8, 1998

[54] OXIDATION SIMULATION METHOD

[75] Inventor: Shigetaka Kumashiro, Tokyo, Japan

[73] Assignee: NEC Corporation, Tokyo, Japan

[21] Appl. No.: 784,902

[22] Filed: Jan. 16, 1997

[30] Foreign Application Priority Data

Jan. 19, 1996 [JP] Japan .................................... 8-025768

[51] Int. Cl.$^6$ ..................................................... G06F 17/50
[52] U.S. Cl. ...................... 364/578; 364/468.28; 364/488
[58] Field of Search ..................................... 364/578, 488, 364/489, 490, 491, 468.26, 468.28, 469.02

[56] References Cited

U.S. PATENT DOCUMENTS

| | | | |
|---|---|---|---|
| 5,367,465 | 11/1994 | Tazawa et al. ............................ | 364/468 |
| 5,377,118 | 12/1994 | Leon et al. ........................ | 364/474.24 |
| 5,379,225 | 1/1995 | Tazawa et al. ............................ | 364/468 |
| 5,495,417 | 2/1996 | Fuduka et al. ........................... | 364/468 |
| 5,677,846 | 10/1997 | Kumashiro ................................ | 364/488 |

OTHER PUBLICATIONS

E. Rank and U. Weinert, "A Simultion System for Diffusive Oxidation of Silicon: A Two–Dimensional Finite Element Approach", IEEE Transactions on Computer–Aided Design, vol. 9, No. 5, May 1990, pp. 543–550.

Sahul, Z.H. et al., "Grid Evolution for Oxidation Simulation Using a Quadtree Based Grid Generator", *Nupad V Digest*, Jun. 1994 IEEE, pp. 155–158.

*Primary Examiner*—Kevin J. Teska
*Assistant Examiner*—Russell W. Frejd
*Attorney, Agent, or Firm*—Young & Thompson

[57] ABSTRACT

High-speed simulation of oxidation is performed even when an overlap occurs between oxide-film shapes. A sweeping quadrilateral is defined accompanying the growth of an oxide film from a line segment composing the surface of the oxide film before the growth, the line segment on the surface of an oxide film after the growth and the dislocation vectors of both ends in these segments. The overlap width of the oxide-film shapes is then acquired by a predetermined figure calculation of these sweeping quadrilaterals between them. A linear estimation is made on the time axis when an overlap between the oxide-film shapes occurs. The growth time of the oxide film is retrogressed so that the overlap width of said oxide-film shapes decreases below a previously specified allowable value. Thereafter, the oxidation simulation is continued with this state made into a renewed initial state.

6 Claims, 5 Drawing Sheets

OXIDATION SIMULATION METHOD

BACKGROUND OF THE INVENTION

1. Field of the Invention

The present invention relates to a computer simulation method of a manufacturing process of semiconductors and more especially to a simulation method of an oxidation process.

2. Description of the Prior Art

One example of this kind of conventional oxidation simulation methods is described in the literature, entitled "International Workshop on Numerical Modeling of Processes and Devices for Integrated Circuits NUPAD V Technical Digest", by Zakir H. Sahul, Eugene W. McKenna, Robert W. Dutton, Jun. 5, 1994, pp.155–158.

According to a simulation of an oxidation process of a concave semiconductor structure such as trench structure, a mutual overlap of oxide-film shapes growing in the process takes place. For a highly accurate simulation, it is required to detect and confine this overlap width below a fixed value.

The approach of oxide simulation described the above-mentioned literature corresponds to this requirement according to the procedure shown in FIG. 4.

As shown in FIG. 4, the time t is forwarded by $\Delta t$, the shape of an oxide film growing in $\Delta t$ is calculated (Step 42), when an overlap occurs between the oxide-film shapes (Step 44), the oxide-film shapes are calculated (Step 42) after the time is retrogressed by $\Delta T$ in accordance with the bisecting method (Step 43), the retrogression processing of the time is performed till the overlap between the oxide-film shapes disappears, and the above-mentioned processing ends when there is no overlap between the oxide-film shapes and the time reaches the termination time (Step 45).

More specifically, as shown in FIG. 5, it is judged in accordance with the presence of mutual crossing of the shape-defining segments constituting the surface of the oxide films in the 2-dimensional space whether an overlap between the oxide-film shapes occurs and if occurs, the growth time of an oxide film is retrogressed by using the bisecting algorithm till the overlap between the shapes disappears, then the oxide simulation is continued with this state made into an initial state. That is, in the surface shapes of oxide films shown in FIG. 5 (A) or 5 (D), an overlap of shapes occurs at the time t1 with the growth of the oxide films, so that the shape-defining segments composing the respective surfaces of the oxide films overlap each other at the time t2 as shown in FIG. 5 (C) or FIG. 5 (F). Thus, the retrogression of time is carried out with the bisecting method, so that the time point is successively renewed in the series of $\tau 1$ ($\tau 1 = \tau 2 - \Delta \tau$, where $\Delta \tau = (t2-t1)/2$), $\tau 2 - \tau 4$ and converges on $\tau 5$. Incidentally, FIGS. 5 (C) and (F) show the examples of time step restriction standards in grid and geometry that the boundaries must not form a self loop and the regions must not crash with each other.

However, the above background art has a problem that it takes a long time for a simulation.

This is because a mutual overlap of oxide films is completely rejected.

That is, with the above conventional method, if a mutual overlap occurs between minutely irregular oxide films finely differing in height, a method to completely rejecting the overlap (calculation method) would lead to an execution of a new simulation with the initial state reset every time a point contact of shapes occurs, so that the time intervals for the growth of oxide films are divided more minutely than required, the progress of time is delayed and it takes a long time for the whole simulation.

Also, the above prior art has another problem that a high-speed processing is difficult because the bisecting method is used in the retrogression algorithm of time intervals when an overlap of oxide-film shapes occurs.

That is, as shown in FIG. 5, this is because the bisecting method requires a plurality of repetitions till the conversion and consequently a plenty of calculation time is needed for the retrogression processing of time intervals.

BRIEF SUMMARY OF THE INVENTION

Thus, it is one object of the present invention to solve the problems in the above prior art and to provide a method enabling a simulation to be carried out at a high speed even if an overlap between oxide-film shapes occurs in the process of an oxidation simulation.

To attain the above object, the present invention provides an oxidation simulation method comprising the steps of: defining in a two-dimensional space a sweeping quadrilateral accompanying the growth of an oxide film from a line segment composing the surface of the oxide film before the growth, the line segment on the surface of an oxide film after the growth and the dislocation vectors of both ends in these segments; and acquiring the overlap width of the oxide-film shapes by a predetermined figure calculation of these sweeping quadrilaterals between them.

In addition, the present invention provides another oxidation simulation method comprising the steps of: defining in a three-dimensional space a sweeping polygonal prism accompanying the growth of an oxide film from a plane composing the surface of the oxide film before the growth, the plane segment on the surface of an oxide film after the growth and dislocation vectors of the vertices thereof; and acquiring the overlap width of the oxide-film shapes by a predetermined figure calculation of these sweeping polygonal prism between them.

And, in a oxidation simulation method according to the present invention, when an overlap between the oxide-film shapes occurs, a linear estimation is made on the time axis and the growth time of the oxide film is retrogressed so that the overlap width of said oxide-film shapes decreases below a previously specified allowable value, then the oxidation simulation is continued with this state made into a renewed initial state.

The present invention is characterized in that the overlap width between oxide-film shapes is calculated and the growth time of the oxide film is retrogressed in accordance with a linear estimation. That is, with the present invention, an overlap of oxide-film shapes at a fixed width is allowed. For this reason, the time intervals are divided more finely than required and no delay takes place in the progress of time even if an overlap between minutely irregular oxide films different in height occurs. In consequence, the total simulation time can be shortened as compared with the present invention.

Furthermore, with the present invention, a linear estimation is employed in the algorithm for a retrogression processing of time intervals. Thanks to this, only a smaller number of repetitions till the conversion is required than that of the above-mentioned bisecting method in the background art. In particular, in the case of actual time interval width where the growth rate of an oxide film can be approximated in terms of a linear expression relative to the time, an appropriate retrogression time of day can be evaluated at one time without need for repeated calculations. Thus, a simulation can be carried out at a higher speed in a shorter calculation time than those of the above background art.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
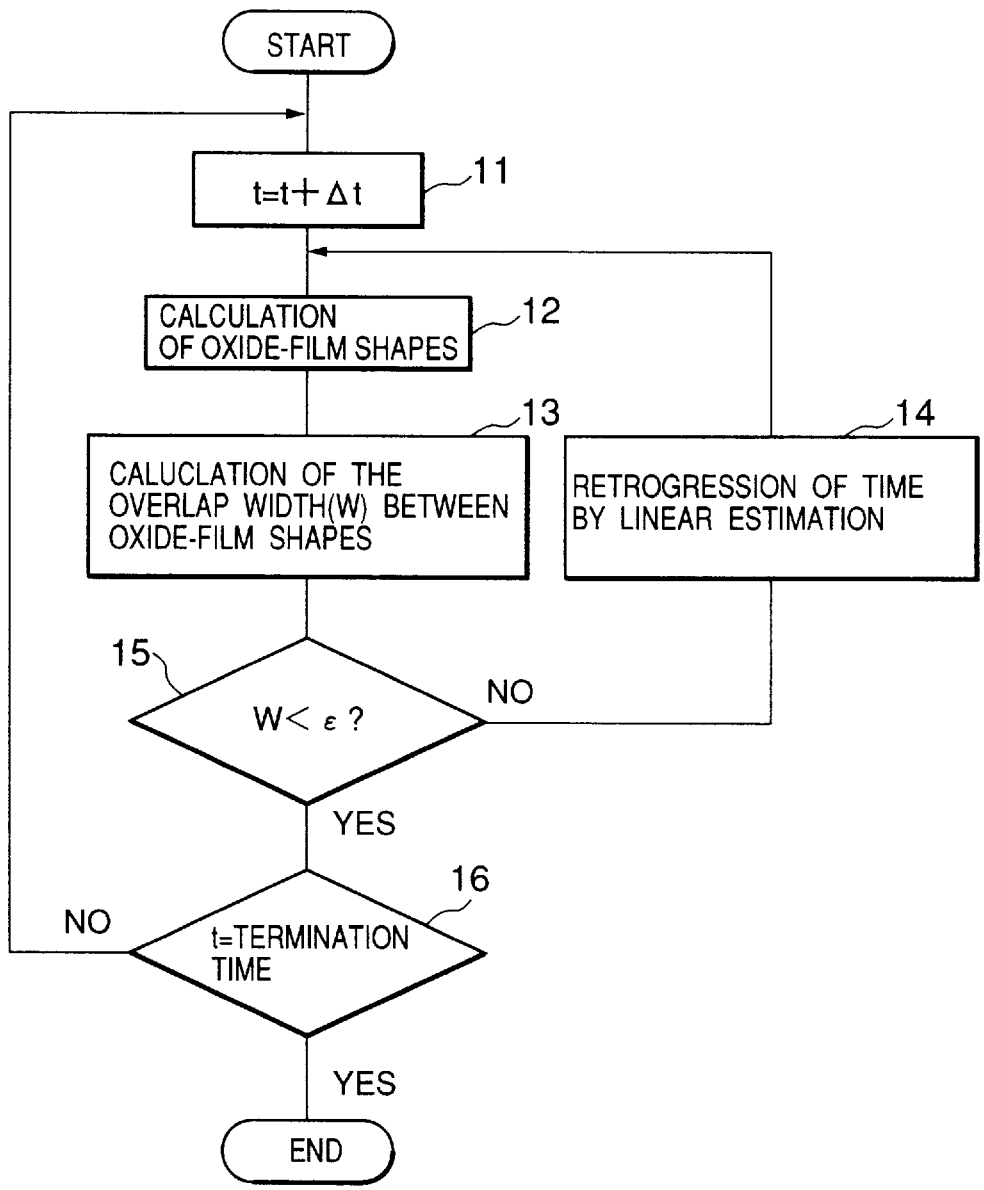
FIG. 1 is a flowchart for illustrating the procedure of one embodiment of the present invention.

Referring to the drawings, embodiments of the present invention will be described below in details.

FIG. 1 shows the procedure of one embodiment of the present invention in a flowchart. First, forward the time from the initial state by $\Delta t$ (Step 11); and dislocate the surface of an oxide film by the width of the oxide film having grown in $\Delta t$ (Step 12).

Next, define a sweeping figure accompanying the growth of an oxide film from the surface of the oxide film before the growth, that of the oxide film after the growth and the dislocation vectors of the vertices composing them and acquire the overlap widths W of oxide-film shapes by figure calculations of these sweeping figures between them (Step 13). The concrete method will be described later in detail.

Next, compare an overlap width W with a previously given allowable overlap width $\epsilon$ (Step 15), check the current time at the step if smaller (Step 16) and unless reaching the termination time of growth of the oxide film, return to Step 11 for forwarding the time again to repeat the processing.

On the other hand, if the overlap width W is larger than $\epsilon$, retrogress the oxide-film growth time so that the overlap width would be equal to or smaller than $\epsilon$ in accordance with a linear estimation (Step 14) and thereafter return to the oxide-film growth step 12.

Next, referring to FIG. 2, one embodiment of means for acquiring the overlap width of oxide-film shapes will be described in detail.

Figure 2:
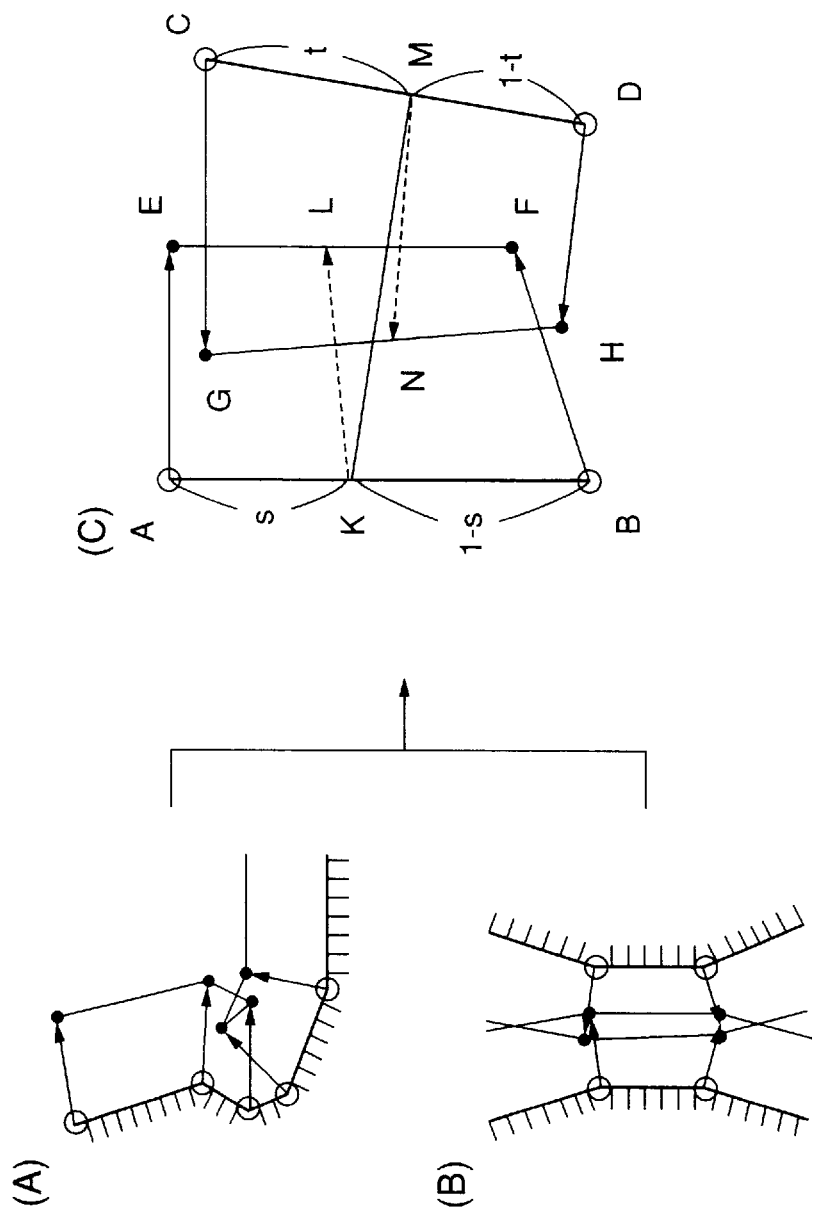
FIG. 2 is a drawing for illustration one embodiment of method for evaluating the overlap width of oxide-film shapes according to the present invention.

FIG. 2 (A) schematically shows circumstances that when a semiconductor oxide film having a concave shape in the 2-dimensional space grows, adjacent surface constituents of the oxide film cross after the dislocation and an overlap of oxide-film shape occurs.

FIG. 2 (B) schematically shows circumstances that when right and left segments constituting the surfaces of the oxide films originally situated at separated positions cross after the dislocation and an overlap of oxide-film shape occurs.

The means for acquiring the overlap width of an oxide-film shape must include these two typical cases and has a general purpose property adaptable for all situations.

One of the means is a method shown in FIG. 2 (C). In FIG. 2 (C), the segments AB and CD compose the surfaces of oxide films before the growth and the segments EF and GH compose the surfaces of oxide films after the growth. In addition, the points K and L are the one internally dividing the segments AB and EF at a ratio of s:1−s (0=<s=<1) and the points M and N are the one internally dividing the segments CD and GH at a ratio of t:1−t (0=<t=<1). In this case, the sweeping quadrilaterals accompanying the growth of an oxide film are ABFE and CDHG.

In this embodiment, a local oxide-film overlap width $\delta KM$ (s, t) is defined as shown in the following formula (1).

$$\delta_{KM}(s, t) = \left| \frac{\vec{KL} \cdot \vec{KM}}{|\vec{KM}|} - \frac{\vec{MN} \cdot \vec{KM}}{|\vec{KM}|} \right| - |\vec{KM}| \quad (1)$$

That is, the local oxide-film overlap width $\delta KM$ (s, t) in the above formula (1) is a value obtained by subtracting the length of the vector KM from the length sum of the projection of the dislocation vector KL onto the vector KM (inner product between the vector KL and the unit vector of the vector KM) and the projection of the dislocation vector MN onto the vector KM.

Using this relation, the local overlap width D AB−CD of oxide-film shapes is evaluated as a maximum value of local oxide-film overlap width $\delta KM$ (s, t) in accordance with the following formula (2).

$$D_{AB-CD} = \max[\delta_{KM}(s, t)] \quad (2)$$

Furthermore, using this local overlap width D AB−CD of oxide-film shapes, the whole overlap width W of oxide-film shapes is calculated in accordance with the following formula (3).

$$W = \max[D] \quad (3)$$

Alternatively, as a simple approach for approximately evaluating D AB−CD, the following formula (4) may be used to estimate a local overlap width only between the dislocation vectors of both ends of the segments.

$$D_{AB-CD} = \max[\delta_{KM}(0, 0), \delta_{KM}(0, 1), \delta_{KM}(1, 0), \delta_{KM}(1, 1)] \quad (4)$$

When the whole overlap width W of oxide-film shapes is larger than a previously specified allowable value (allowable overlap width) $\epsilon$, the dislocation vectors KL and MN are approximated in accordance with the following formulae (5) and (6) by using first-order local growth speeds v KL (s) and v MN (t).

$$\vec{KL} = v_{KL}(s) \Delta t \quad (5)$$

$$\vec{MN} = v_{MN}(t) \Delta t \quad (6)$$

Since the local oxide-film overlap width $\delta KM$ (s, t) is expressed in terms of a linear equation concerning the time interval width $\Delta t$, such a time can be easily evaluated as the local overlap width will be below the allowable value $\epsilon$.

And, out of the time points obtained thus, the earliest one is adopted as the growth regression time t−"τ of the whole oxide-film shape. Incidentally, for estimation of the overlap width in evaluating the regression time, a simplified method by estimating the overlap width only between the dislocation vectors of both ends in the segments can be used as mentioned above.

Figure 4:
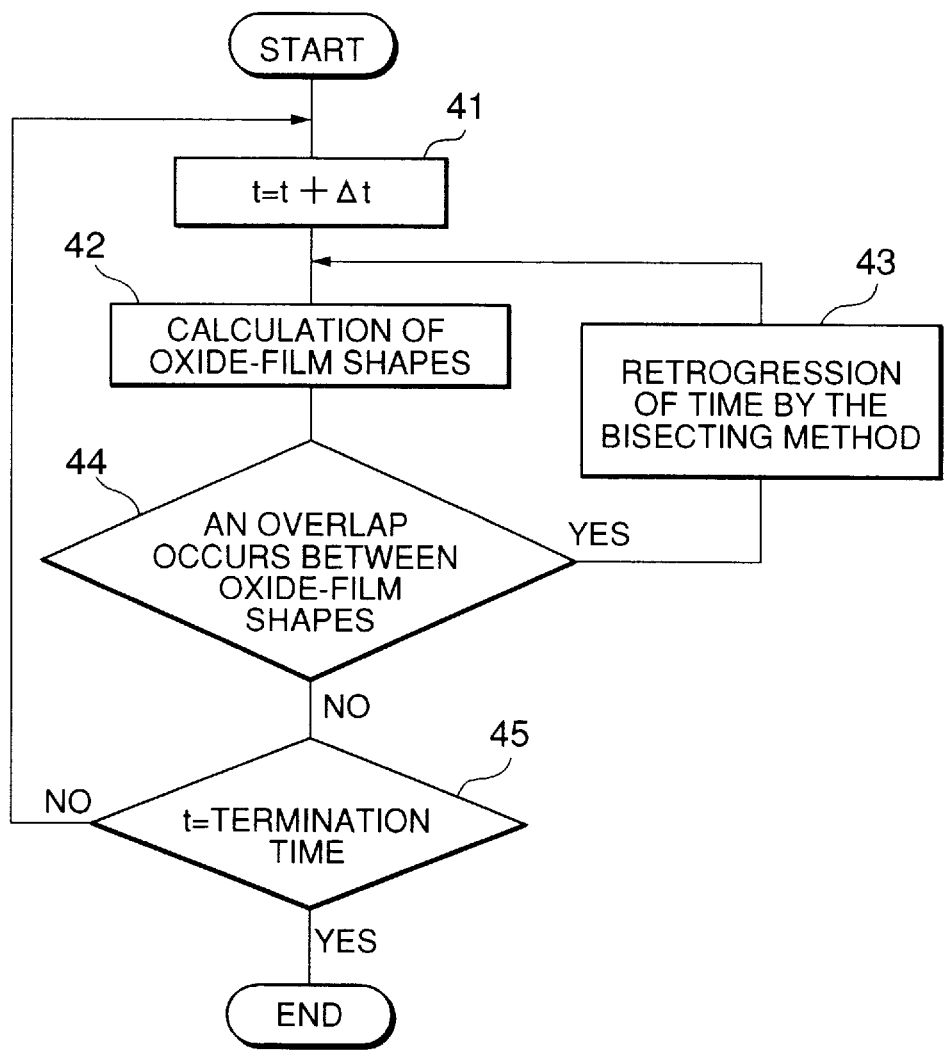
FIG. 4 is a flowchart for illustrating the procedure of the background art.
Figure 5:
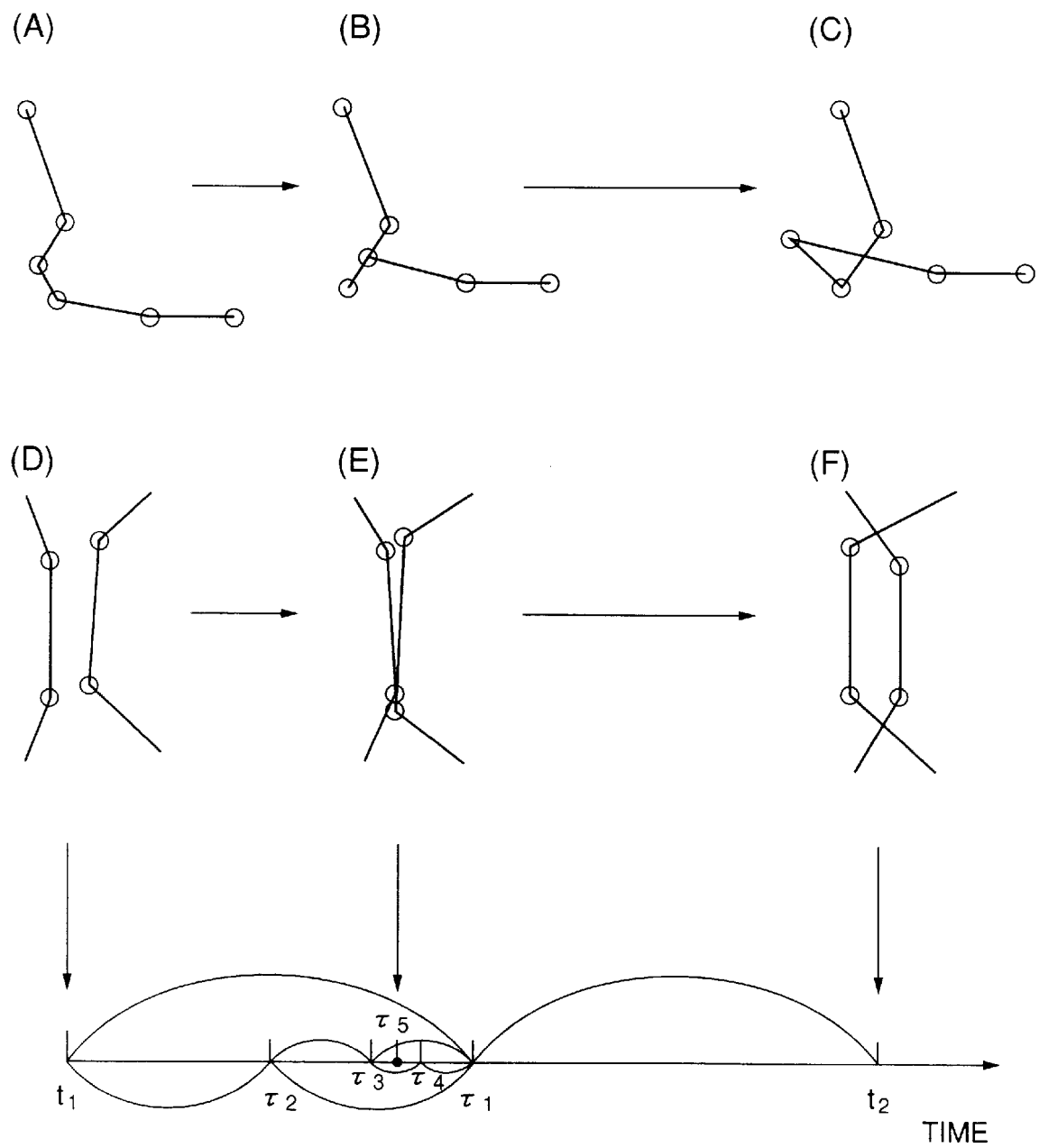
FIG. 5 is a drawing for illustrating a method for determining the retrogression time of oxide-film growth according to the background art.

Next, referring to FIG. 4, a second embodiment of means for acquiring the overlap width of oxide-film shapes will be described in detail.

Figure 3:
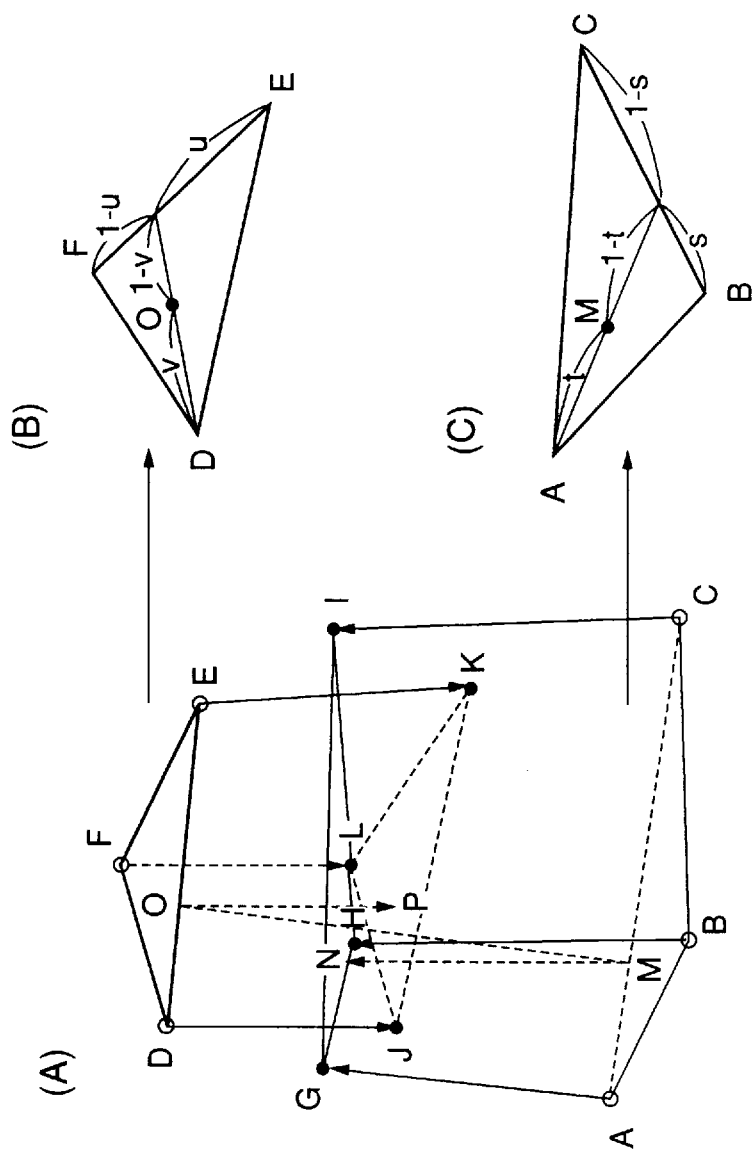
FIG. 3 is a drawing for illustration another embodiment of method for evaluating the overlap width of oxide-film shapes according to the present invention.

FIG. 3 (A) schematically shows the circumstances that the upper and lower oxide-film surfaces originally situated at separated positions in a three-dimensional space passes each other after the dislocation and an overlap of oxide-films occurs. In FIG. 3 (A), the triangles ABC and DEF individually compose the surface of the oxide film before the growth, whereas the triangles GHI and JKL individually compose the surface of the oxide film after the growth. The points M and N internally divide the triangles ABC and JKL respectively with parameters (s, t) as shown in FIG. 3 (C), whereas the points O and P internally divide the triangles DEF and JKL respectively with parameters (u, v) as shown in FIG. 3 (B). Incidentally, the sweeping polygonal prisms is the polygonal prism defined by the triangles ABC and GHI and the one defined by the triangles DEF and JKL.

With this embodiment, the local oxide-film overlap width δMO (s, t, u, v) is defined as shown in the following formula (7).

$$\delta_{MO}(s, t, u, v) = \left| \frac{\overrightarrow{MN} \cdot \overrightarrow{MO}}{|\overrightarrow{MO}|} - \frac{\overrightarrow{OP} \cdot \overrightarrow{MO}}{|\overrightarrow{MO}|} \right| - |\overrightarrow{MO}| \qquad (7)$$

Using this relation, the local oxide-film overlap width of oxide-film shapes is evaluated in accordance with the following formula (8).

$$D_{ABC-DEF} = \max [\delta_{MO}(s, t, u, v)] \qquad (8)$$

Furthermore, using the local oxide-film overlap width of oxide-film shapes, the whole overlap width of oxide-film shapes is evaluated in accordance with the following formula (9).

$$W = \max [D] \qquad (9)$$

Alternatively, as a simplified approach for approximately evaluating D ABC–DEF, the following formula (10) may be used to calculate a local overlap width only between the dislocation vectors of triangle vertices.

$$\begin{aligned} D_{ABC-DEF} = \max[&\delta_{MO}(0, 0, 0, 0), \delta_{MO}(0, 0, 0, 1), \delta_{MO}(0, 0, 1, 0), \\ &\delta_{MO}(0, 0, 1, 1), \delta_{MO}(0, 1, 0, 0), \delta_{MO}(0, 1, 0, 1), \\ &\delta_{MO}(0, 1, 1, 0), \delta_{MO}(0, 1, 1, 1), \delta_{MO}(1, 0, 0, 0), \\ &\delta_{MO}(1, 0, 0, 1), \delta_{MO}(1, 0, 1, 0), \delta_{MO}(1, 0, 1, 1), \\ &\delta_{MO}(1, 1, 0, 0), \delta_{MO}(1, 1, 0, 1), \delta_{MO}(1, 1, 1, 0), \\ &\delta_{MO}(1, 1, 1, 1)] \end{aligned} \qquad (10)$$

When the whole overlap width W of oxide-film shapes is larger than a previously specified allowable value ε, the dislocation vectors MN and OP are approximated in accordance with the following formulae (11) and (12) by using first-order local growth speeds v MN (s, t) and v OP (s, t).

$$\overrightarrow{MN} = v_{MN}(s, t) \Delta t \qquad (11)$$

$$\overrightarrow{OP} = v_{OP}(u, v) \Delta t \qquad (12)$$

Since the local oxide-film overlap width δMO (s,t,u,v) is expressed in terms of a linear equation concerning the time interval width Δt, such a time can be easily evaluated as the local overlap width will be below the allowable value ε. Out of the time points obtained thus, the earliest one is adopted as the growth regression time t−Δτ of the whole oxide-film shape. Incidentally, for estimation of the overlap width in evaluating the regression time, a simplified approach by estimating the overlap width only between the dislocation vectors of triangle vertices can be used as mentioned above.

In addition, if the new and old triangular interfaces comprise figures other than triangles, they can be treated in a similar way by dividing them into a plurality of triangles.

As described above, the present invention has an advantage that the time intervals are divided more finely than required and consequently no delay takes place in the progress of time even if an overlap between minutely irregular oxide films different in height occurs in the process of oxide-film growth.

This is because an overlap of oxide-film shapes at a fixed width ε is allowable according to the present invention and the time intervals reaching to the allowable width can be used without interruption during a simulation according to the present invention.

In addition, the present invention has an advantage that a retrogression processing of time intervals to be executed when a wider overlap of oxide-film shapes than the allowable width occurs can be accomplished in a short calculation time.

This is because a linear estimation is employed for a retrogression processing of time intervals unlike a conventional bisecting method and, especially in actual time interval width for a case where the growth rate of an oxide film can be linearly approximated in terms of a linear expression relative to the time, an appropriate retrogression time of day can be evaluated at one time.

What is claimed is:

1. An oxidation simulation method comprising the steps of:

defining in a two-dimensional space a sweeping quadrilateral accompanying the growth of an oxide film from a line segment composing the surface of the oxide film before the growth, the line segment on the surface of an oxide film after the growth and the dislocation vectors of both ends in these segments; and acquiring the overlap width of the oxide-film shapes by a predetermined figure calculation of these sweeping quadrilaterals between them.

2. An oxidation simulation method comprising the steps of:

defining in a three-dimensional space a sweeping polygonal prism accompanying the growth of an oxide film from a plane composing the surface of the oxide film before the growth, the plane segment on the surface of an oxide film after the growth and dislocation vectors of the vertices thereof; and acquiring the overlap width of the oxide-film shapes by a predetermined figure calculation of these sweeping polygonal prism between them.

3. The oxidation simulation method as set forth in claim 1 wherein, when an overlap between the oxide-film shapes occurs, a linear estimation is made on the time axis and the growth time of the oxide film is retrogressed so that the overlap width of said oxide-film shapes decreases below a previously specified allowable value before the oxidation simulation is continued with this state made into a renewed initial state.

4. The oxidation simulation method as set forth in claim 2, wherein, when an overlap between the oxide-film shapes occurs, a linear estimation is made on the time axis and the growth time of the oxide film is retrogressed so that the overlap width of said oxide-film shapes decreases below a previously specified allowable value before the oxidation simulation is continued with this state made into a renewed initial state.

5. The oxidation simulation method as set forth in claim 1, wherein a plurality of local overlap widths of said oxide films are found and the whole overlap width of said oxide-film shapes is evaluated from these local overlap widths.

6. The oxidation simulation method as set forth in claim 5, wherein, when the overlap width of said oxide-film shapes exceeds a previously specified value, the retrogression times of day are calculated with the approximation of a linear formula concerning time interval width by using local linear growth speeds of said oxide film and the earliest time of day is used as the whole growth retrogression time of said oxide film.

* * * * *